United States Patent
Gudaitis et al.

(10) Patent No.: US 9,154,093 B2
(45) Date of Patent: Oct. 6, 2015

(54) LIQUID DROP DETECTION USING BACKSCATTERED LIGHT WITH AMPLIFIERS

(71) Applicant: HEWLETT-PACKARD DEVELOPMENT COMPANY, L.P., Houston, TX (US)

(72) Inventors: Algird M. Gudaitis, Vancouver, WA (US); David E. Smith, Vancouver, WA (US)

(73) Assignee: HEWLETT-PACKARD DEVELOPMENT COMPANY, L.P., Houston, TX (US)

( * ) Notice: Subject to any disclaimer, the term of this patent is extended or adjusted under 35 U.S.C. 154(b) by 318 days.

(21) Appl. No.: 13/750,500

(22) Filed: Jan. 25, 2013

(65) Prior Publication Data

US 2014/0209787 A1    Jul. 31, 2014

(51) Int. Cl.
*G02B 6/42* (2006.01)
*H03F 3/45* (2006.01)
*H03F 3/08* (2006.01)
*G01P 13/00* (2006.01)

(52) U.S. Cl.
CPC ........ *H03F 3/45475* (2013.01); *G01P 13/0006* (2013.01); *H03F 3/087* (2013.01); *H03F 2200/261* (2013.01); *H03F 2203/45526* (2013.01)

(58) Field of Classification Search
CPC ...... B41J 2/04561; B41J 2/125; B41J 2/2142; H03F 3/68; G01N 15/0211; G01N 2021/4709; G01N 21/532; C09D 11/30
USPC ....... 250/227.25, 221, 214 R, 214.1, 214 LA, 250/214 AL; 347/14–19; 356/70–73, 440
See application file for complete search history.

(56) References Cited

U.S. PATENT DOCUMENTS

| | | |
|---|---|---|
| 5,434,430 A | 7/1995 | Stewart |
| 6,086,190 A | 7/2000 | Schantz et al. |
| 8,783,822 B2 * | 7/2014 | Sakurada .......... 347/19 |
| 2012/0139982 A1 | 6/2012 | Abe |

FOREIGN PATENT DOCUMENTS

| | | |
|---|---|---|
| WO | 2012030344 | 3/2012 |
| WO | 2012044307 | 4/2012 |

* cited by examiner

*Primary Examiner* — Que T Le
(74) *Attorney, Agent, or Firm* — Dicke, Billig & Czaja, PLLC

(57) ABSTRACT

A system includes a photodetector, a first amplifier, a second amplifier, and a filter. The photodetector is to detect backscattered light from liquid drops to provide a current signal. The first amplifier is to convert the current signal into a first voltage signal. The second amplifier is to amplify the first voltage signal to provide a second voltage signal, and the filter is to filter the second voltage signal to provide an output signal to indicate the presence or absence of liquid drops.

18 Claims, 7 Drawing Sheets

LIQUID DROP DETECTION USING BACKSCATTERED LIGHT WITH AMPLIFIERS

BACKGROUND

In some applications, drop detection devices are utilized to detect liquid drops ejected by ejector nozzles. Based on the detection of liquid drops, the status of a particular nozzle or groups of nozzles can be diagnosed. In some cases, light scattering from the ejected drops is used in the drop detection devices.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined with each other, unless specifically noted otherwise.

Figure 1:
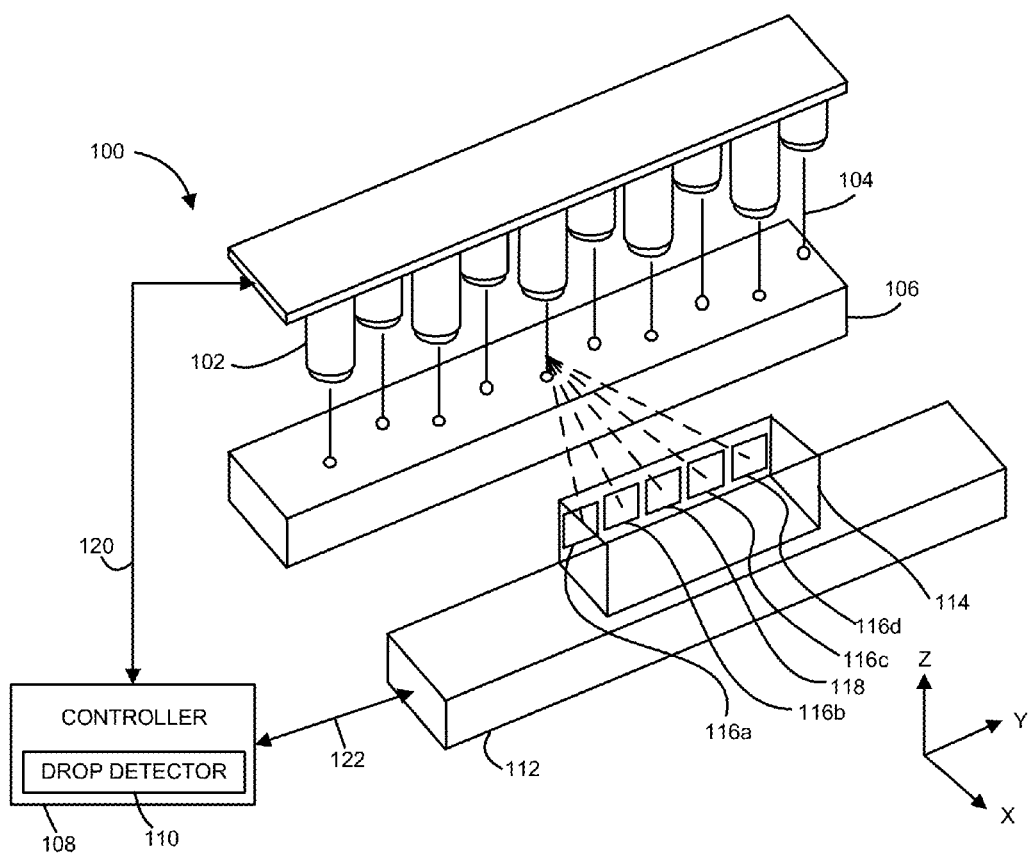
FIG. 1 illustrates one example of a drop detector arrangement.

FIG. 1 illustrates one example of a drop detector arrangement 100. Drop detector arrangement 100 includes a plurality of drop ejectors 102 to dispense a liquid droplet 104. Drop detector arrangement 100 further includes a service station 106, a controller 108, and a carriage assembly 112 that supports a moveable backscatter drop detector 114. Controller 108 includes a drop detector circuit 110. In one example, drop detector circuit 110 is housed in drop detector 114. Controller 108 is electrically coupled to drop ejectors 102 through signal path 120 and to carriage assembly 112 through signal path 122.

Backscatter drop detector 114 includes a light source 118 and photodetectors 116a, 116b, 116c, and 116d. Photodetectors 116a and 116b are arranged on a first side of light source 118, and photodetectors 116c and 116d are arranged on a second side of light source 118 opposite the first side. In the illustration of FIG. 1, light emitted by light source 118 is projected in an x-axis direction, while droplets 104 drop in a z-axis direction. Backscatter drop detector 114 is movable along carriage assembly 112 in a y-axis direction such that the light emitted by light source 118 may be aligned with droplets 104 ejected from a selected ejector 102. Each photodetector 116a-116d is coupled to drop detector circuit 110 of controller 108, which processes light signals that are detected by photodetectors 116a-116d.

In operation of one example, drop detector arrangement 100 is for use in a variety of applications where the controlled ejection of liquid droplets 104 is to be monitored. For example, in one application ink drops are deposited on print media in a print engine for an inkjet printer. In such a printer, drop detector arrangement 100 may be used to monitor the ejection of ink during a testing mode of the printer. In other applications, drop detector arrangement 100 may be used to monitor the ejection of liquid in biochemical tests, diagnostic strips, or device coating applications. In one example, controller 108 controls the plurality of drop ejectors 102 such that liquid droplets 104 are controllably ejected to service station 106. In one example, print media is received adjacent to service station 106 such that liquid droplets 104 are controllably deposited on the print media.

Various configurations of ejectors 102 are possible according to various examples. For example, pluralities of ejectors 102 can be formed in a silicon die, sometimes in staggered rows across a distance in the x-axis direction as illustrated in FIG. 1. In ink applications where multiple colored inks are used, multiple sets of rows of ejectors 102 may be used.

Controller 108 controls carriage assembly 112 to position backscatter drop detector 114 such that backscatter drop detector 114 is aligned with a selected drop ejector 102. In one example, light source 118 projects light in the x-axis direction into the path of a liquid droplet 104 ejected from the selected drop ejector 102. As such, when liquid droplets 104 are ejected from the selected drop ejector 102 in the z-axis direction, liquid droplets 104 pass through the projected light as they drop to service station 106.

In various examples, light source 118 includes a laser source, a light emitting diode (LED), or another suitable light source. In various examples, light source 118 produces a light beam with an elliptical or rectangular profile (i.e., a larger width in the y-axis direction than a height in the z-axis direction). As a liquid droplet 104 passes through the light beam, light from the light beam is scattered in various directions. Some of the backscattered light will enter photodetectors 116a-116d. In one example, photodetectors 116a-116d are photodiodes.

In one example, light detected by photodetectors 116a-116d from the light scattering that occurred when liquid droplet 104 passed through the light beam can be used to measure the effectiveness or status of liquid droplet 104 from one or more of ejectors 102. For example, if controller 108 directs one particular drop ejector 102 to eject a liquid droplet 104 at a particular point in time and positions backscatter drop detector 114 to be aligned with the particular drop ejector 102 at the same point in time, corresponding light backscattering from liquid droplet 104 should enter photodetectors 116a-116d. By monitoring the detected light and correlating it with control signals from controller 108, a determination can be made as to whether a liquid droplet 104 did in fact eject, as well as determinations about the size, velocity, and quality of liquid droplet 104.

Drop detector circuit 110 processes the signals from photodetectors 116a-116d. In one example, even though extremely low light levels are generated by the backscatter of light off of tiny (e.g., picoliters in volume) liquid droplets, drop detector circuit 110 converts these signals to voltage levels suitable for analog to digital conversion in the 0 to 3.3 volt range while rejecting the majority of noise created by spurious reflections and electrical sources. As will be described below, drop detector circuit 110 includes three stages of amplification with regards to gain, dynamic range, and filtering characteristics in relationship to the backscatter signals from photodetectors 116a-116d. In addition, by keeping all the signals in the linear range of drop detector circuit 110, post-processing of the output signal of drop detector circuit 110 can perform further analysis to access whether there was a liquid droplet signal present, even in the midst of the remaining noise signals.

While the following FIGS. 2-7 illustrate examples with reference to detecting ink drops in an inkjet printer application, the examples are also applicable to detecting other liquid drops in other applications.

Figure 2:
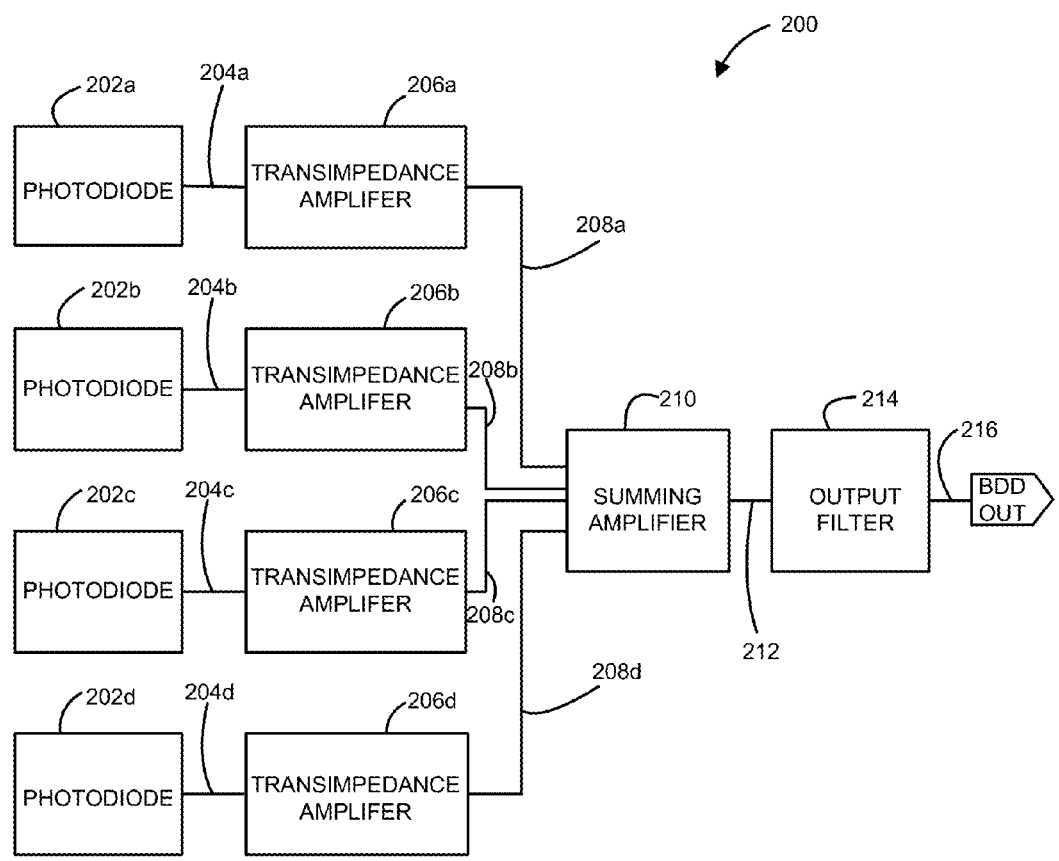
FIG. 2 is a block diagram illustrating one example of a drop detector circuit.

FIG. 2 is a block diagram illustrating one example of a drop detector circuit 200. In one example, drop detector circuit 200 provides drop detector circuit 110 previously described and illustrated with reference to FIG. 1. Drop detector circuit 200 includes photodiodes 202a, 202b, 202c, and 202d, transimpedance amplifiers 206a, 206b, 206c, and 206d, a summing amplifier 210, and an output filter 214. In one example, photodiodes 202a, 202b, 202c, and 202d provide photodetectors 116a, 116b, 116c, and 116d, respectively, as previously described and illustrated with reference to FIG. 1.

The output of photodiode 202a is electrically coupled to the input of transimpedance amplifier 206a through signal path 204a. The output of photodiode 202b is electrically coupled to the input of transimpedance amplifier 206b through signal path 204b. The output of photodiode 202c is electrically coupled to the input of transimpedance amplifier 206c through signal path 204c. The output of photodiode 202d is electrically coupled to the input of transimpedance amplifier 206d through signal path 204d.

The output of transimpedance amplifier 206a is electrically coupled to a first input of summing amplifier 210 through signal path 208a. The output of transimpedance amplifier 206b is electrically coupled to a second input of summing amplifier 210 through signal path 208b. The output of transimpedance amplifier 206c is electrically coupled to a third input of summing amplifier 210 through signal path 208c. The output of transimpedance amplifier 206d is electrically coupled to a fourth input of summing amplifier 210 through signal path 208d. The output of summing amplifier 210 is electrically coupled to the input of output filter 214 through signal path 212. The output of output filter 214 provides a backscatter drop detector output (bddout) signal on signal path 216.

In response to detecting backscattered light from ink drops, each photodiode 202a-202d outputs a current signal. Each transimpedance amplifier 206a-206d receives the current signal from the respective photodiode 202a-202d and converts and amplifies the current signal to provide a first voltage signal. Summing amplifier 210 receives each of the first voltage signals from the respective transimpedance amplifiers 206a-206d and sums and amplifies the first voltage signals to provide a second voltage signal. Output filter 214 receives the second voltage signal and low pass filters the second voltage signal to provide the backscatter drop detector output signal. The backscatter drop detector output signal indicates the presence or absence of ink drops. In one example, the backscatter drop detector output signal includes a pulse for each series of detected ink drops. In one example, eight ink drops ejected in succession results in one pulse.

Figure 3:
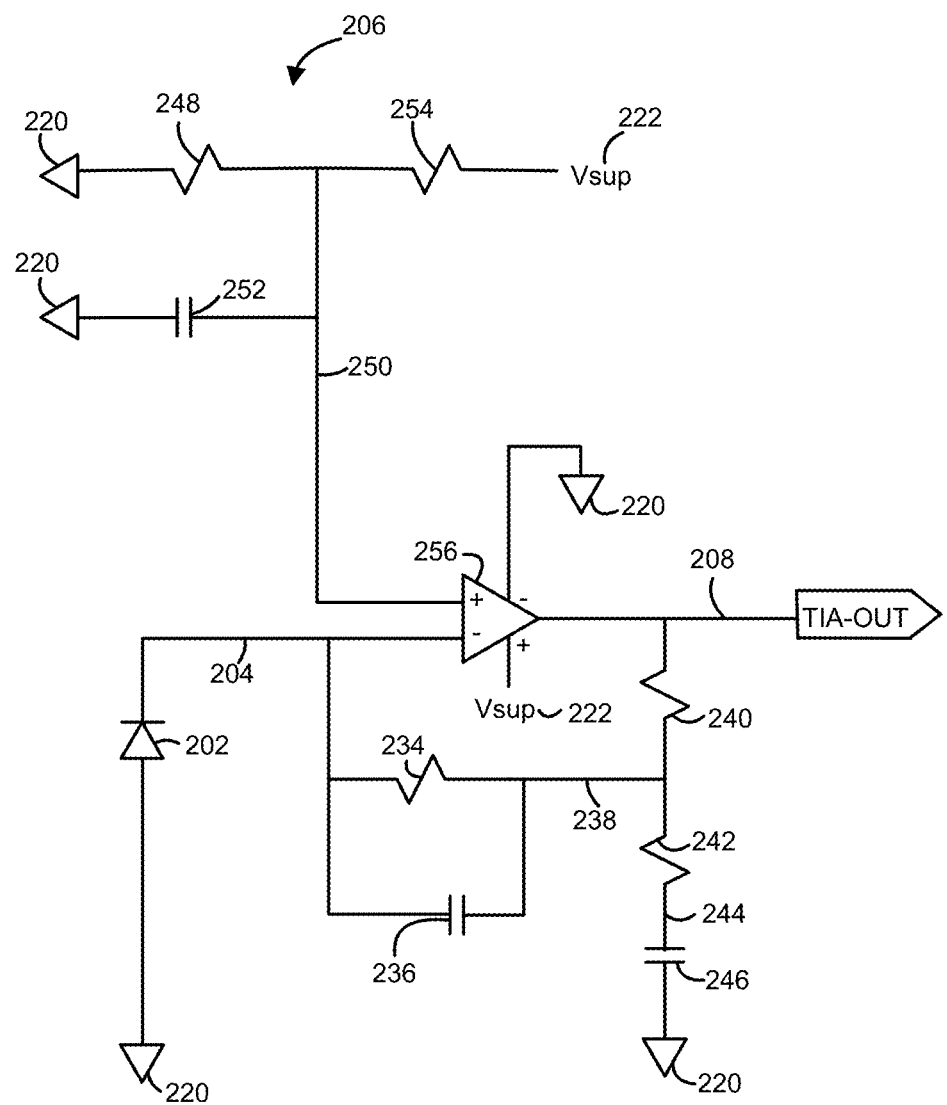
FIG. 3 is a circuit diagram illustrating one example of a transimpedance amplifier.

FIG. 3 is a circuit diagram illustrating one example of a transimpedance amplifier 206. In one example, a transimpedance amplifier 206 is provided for each transimpedance amplifier 206a-206d previously described and illustrated with reference to FIG. 2. Transimpedance amplifier 206 includes resistors 234, 240, 242, 248, and 254, capacitors 236, 246, and 252, and an operational amplifier 256. A photodiode 202 is electrically coupled to the input of transimpedance amplifier 206. In one example, photodiode 202 provides photodiode 202a, 202b, 202c, or 202d previously described and illustrated with reference to FIG. 2.

The anode of photodiode 202 is electrically coupled to a common or ground 220. The cathode of photodiode 202 is electrically coupled to the inverting input terminal of operational amplifier 256, one terminal of resistor 234, and one terminal of capacitor 236 through signal path 204. The other terminal of resistor 234 and the other terminal of capacitor 236 are electrically coupled to one terminal of resistor 240 and one terminal of resistor 242 through signal path 238. The other terminal of resistor 242 is electrically coupled to one terminal of capacitor 246 through signal path 244. The other terminal of capacitor 246 is electrically coupled to common or ground 220. The other terminal of resistor 240 is electrically coupled to the output terminal of operational amplifier 256 through transimpedance amplifier output (tia-out) signal path 208.

One terminal of resistor 248 is electrically coupled to common or ground 220. The other terminal of resistor 248 is electrically coupled to one terminal of resistor 254, one terminal of capacitor 252, and the non-inverting input terminal of operational amplifier 256 through signal path 250. The other terminal of resistor 254 is electrically coupled to a voltage supply (Vsup) 222. In one example, voltage supply 222 is 5 volts or another suitable voltage. The other terminal of capacitor 252 is electrically coupled to common or ground 220. The negative power supply input terminal of operational amplifier 256 is electrically coupled to common or ground 220, and the positive power supply input terminal of operational amplifier 256 is electrically coupled to supply voltage 222.

Transimpedance amplifier 206 converts a current signal provided by photodiode 202 at the inverting input of operational amplifier 256 into a voltage signal at the output of operational amplifier 256. Resistor 234 sets the current-to-voltage resistance from the output of operational amplifier 256 through the voltage divider provided by resistor 240, resistor 242, and capacitor 246 back to the inverting input of operational amplifier 256. In one example, resistor 234 is 14.7 mega-ohms, resistor 240 is 127 kilo-ohms, resistor 242 is 4.75 kilo-ohms, capacitor 246 is 0.22 micro-farads, and capacitor 236 is 5.6 pico-farads. In other examples, resistors 234, 240, and 242, and capacitors 236 and 246 have other suitable values.

In one example, the DC gain of transimpedance amplifier 206 is about ⅟₂₈ (i.e., one twenty-eighth) as large as the AC gain so that slowly changing currents (e.g., currents due to changes in the background reflections off of internal structures) are amplified ⅟₂₈ as much as rapidly changing signals like those produced due to ink drops entering or leaving the field of view of photodiode 202. In other examples, the AC gain is 10 times, 20 times, or another suitable factor greater than the DC gain. In one example, the factor of 28 is approximately the maximum operational amplifier 256 can deliver over the frequency range contained in the ink drop signals. The transition frequency from DC to AC response is selected to pass the ink drop pulses but reject slower changes in background light levels.

Operational amplifier 256 is biased by the voltage divider provided by resistor 248, resistor 254, and capacitor 252 at the non-inverting input of operational amplifier 256 to about ⅓ (i.e., one third) of the supply voltage to allow significant negative swings but larger positive swings or shifts due to the combined effects of DC and AC signal swings. If operational amplifier 256 were biased close to ground, sudden negative shifts (or the removal of positive shifts) would cause operational amplifier 256 to clip at the ground rail, thereby preventing amplification of ink drop backscatter pulses riding on top of the shifts. By biasing operational amplifier 256 to about ⅓ of the supply voltage, this clipping is minimized or avoided even when a combination of desired and undesired signals is present. In one example, resistor 248 is 150 kilo-ohms, resistor 254 is 301 kilo-ohms, and capacitor 252 is 1.0 microfarad. In other examples, resistors 248 and 254 and capacitor 252 have other suitable values.

Figure 4:
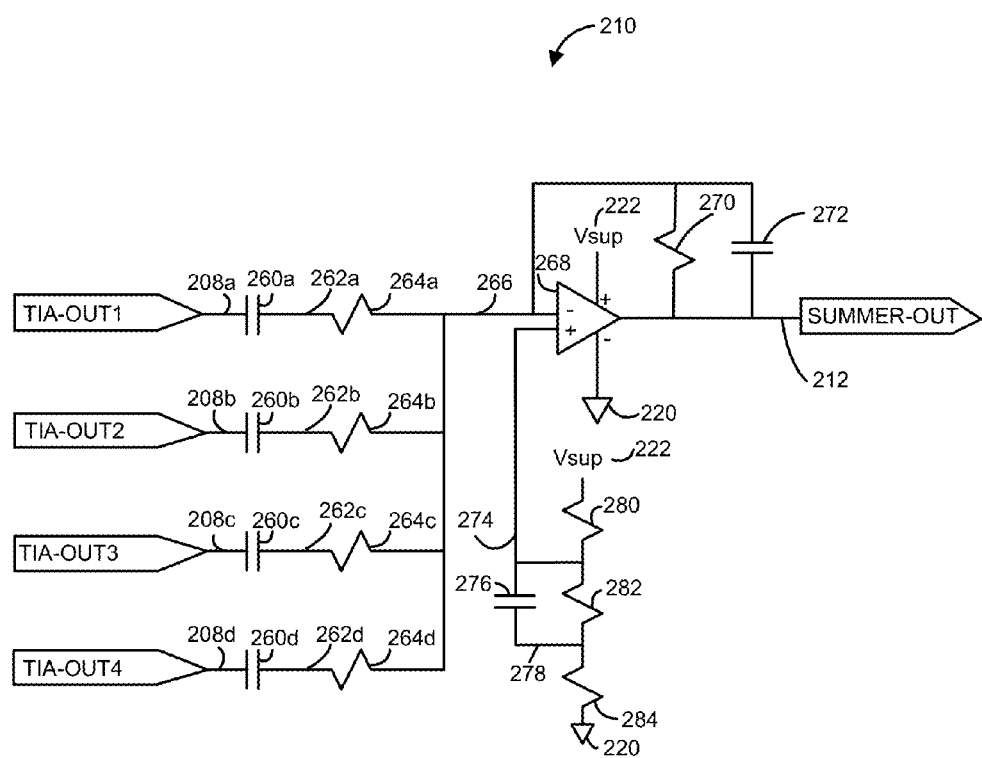
FIG. 4 is a circuit diagram illustrating one example of a summing amplifier.

FIG. 4 is a circuit diagram illustrating one example of summing amplifier 210. Summing amplifier 210 includes capacitors 260a, 260b, 260c, 260d, 272, and 276, resistors 264a, 264b, 264c, 264d, 270, 280, 282, and 284, and an operational amplifier 268.

One terminal of capacitor 260a receives the first transimpedance amplifier output (tia-out1) signal through signal path 208a. The other terminal of capacitor 260a is electrically coupled to one terminal of resistor 264a through signal path 262a. One terminal of capacitor 260b receives the second transimpedance amplifier output (tia-out2) signal through signal path 208b. The other terminal of capacitor 260b is electrically coupled to one terminal of resistor 264b through signal path 262b. One terminal of capacitor 260c receives the third transimpedance amplifier output (tia-out3) signal through signal path 208c. The other terminal of capacitor 260c is electrically coupled to one terminal of resistor 264c through signal path 262c. One terminal of capacitor 260d receives the fourth transimpedance amplifier output (tia-out4) signal through signal path 208d. The other terminal of capacitor 260d is electrically coupled to one terminal of resistor 264d through signal path 262d. The other terminal of resistor 264a, the other terminal of resistor 264b, the other terminal of resistor 264c, and the other terminal of resistor 264d are electrically coupled to the inverting input terminal of operational amplifier 268, one terminal of resistor 270, and one terminal of capacitor 272 through signal path 266.

The other terminal of resistor 270 and the other terminal of capacitor 272 are electrically coupled to the output terminal of operational amplifier 268 through summer output (summer-out) signal path 212. The positive power supply input terminal of operational amplifier 268 is electrically coupled to voltage supply 222, and the negative power supply input terminal of operational amplifier 268 is electrically coupled to common or ground 220.

One terminal of resistor 280 is electrically coupled to voltage supply 222. The other terminal of resistor 280 is electrically coupled to the non-inverting input terminal of operational amplifier 268, one terminal of capacitor 276, and one terminal of resistor 282 through signal path 274. The other terminal of capacitor 276 and the other terminal of resistor 282 are electrically coupled to one terminal of resistor 284 through signal path 278. The other terminal of resistor 284 is electrically coupled to common or ground 220.

Summing amplifier 210 is an AC-coupled summing amplifier that responds to changes in the transimpedance amplifier output voltage signal from each of the transimpedance amplifiers 206a-206d previously described and illustrated with reference to FIG. 2. The gain of each section provided by resistor 270 and each resistor 264a, 264b, 264c, and 264d, respectively, is set to create nearly full scale output voltage swings without clipping at either voltage rail of operational amplifier 268, even with the largest photocurrent signals, after amplification by the transimpedance amplifiers, produced by ink drops backscattering the incident light directed at them. As such, operational amplifier 268 has a gain set to create full scale output voltage signal swings without clipping at either voltage rail even when a combination of desired and undesired signals is present. In one example, resistor 270 is 31.6 kilo-ohms and resistors 264a-264d are each 7.5 kilo-ohms. In other examples, resistors 270 and 264a-264d have other suitable values.

The AC coupling time constant created by the input RC pairs (e.g., resistor 264a and capacitor 260a) is selected to pass the relatively fast voltage changes produced by ink drops entering and leaving the field of view of the photodiodes. The AC coupling time constant, however, is selected to reject relatively slow voltage changes that may include fluctuations produced by movement of the backscatter drop detector and reflections from an imperfectly uniform "black strip" background or the backscatter drop detector's entry or exit out of a cloud of aerosol particles. In one example, each resistor 264a-264d is 7.5 kilo-ohms, and each capacitor 260a-260d is 0.047 micro-farads. In other examples, resistors 264a-264d and capacitors 260a-260d have other suitable values.

A low pass function is provided by the interaction of capacitor 272 and resistor 270. In one example, capacitor 272 is 1000 pico-farads and resistor 270 is 31.6 kilo-ohms. In other examples, capacitor 272 and resistor 270 have other suitable values. Operational amplifier 268 is biased at the non-inverting input of operational amplifier 268 by the voltage divider provided by resistor 280, resistor 282, resistor 284, and capacitor 276. The bias is selected to maximize the allowed (asymmetrical) signal swing produced due to the ink drops (once processed by the transimpedance amplifiers) without clipping operational amplifier 268 at either rail. In one example, resistor 280 is 64.9 kilo-ohms, resistor 282 is 47.5 kilo-ohms, resistor 284 is 49.9 ohms, and capacitor 276 is 1 micro-farad. In other examples, resistors 280, 282, and 284, and capacitor 276 have other suitable values.

Figure 5:
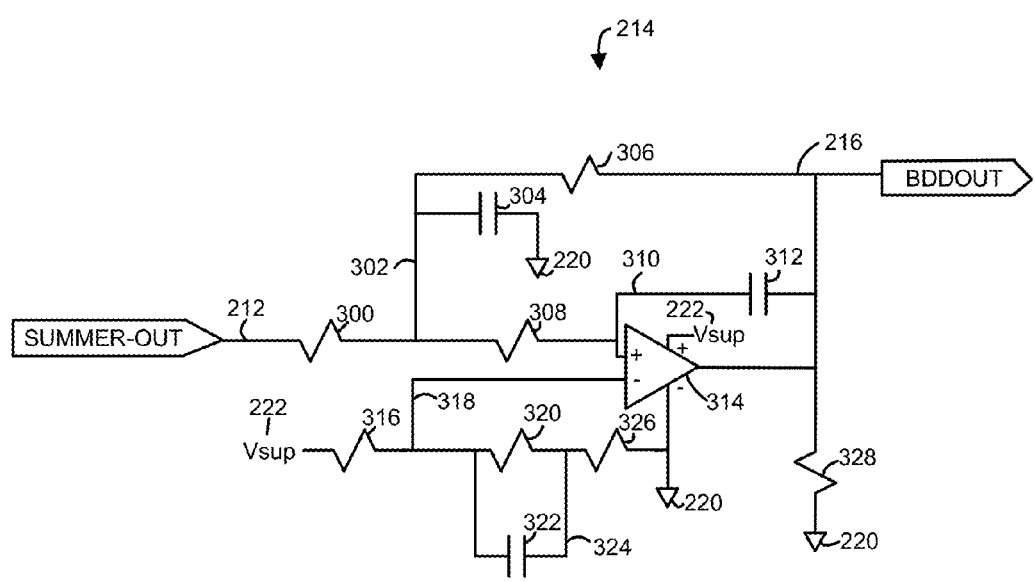
FIG. 5 is a circuit diagram illustrating one example of an output filter.

FIG. 5 is a circuit diagram illustrating one example of output filter 214. Output filter 214 includes resistors 300, 306, 308, 316, 320, 326, and 328, capacitors 304, 312, and 322, and an operational amplifier 314. One terminal of resistor 300 receives the summer output signal on signal path 212. The other terminal of resistor 300 is electrically coupled to one terminal of resistor 306, one terminal of capacitor 304, and one terminal of resistor 308 through signal path 302. The other terminal of resistor 306 is electrically coupled to one terminal of capacitor 312, the output terminal of operational amplifier 314, and one terminal of resistor 328 through backscatter drop detection output (bddout) signal path 216. The other terminal of resistor 328 is electrically coupled to common or ground 220. The other terminal of capacitor 304 is electrically coupled to common or ground 220. The other terminal of resistor 308 is electrically coupled to the other terminal of capacitor 312 and the inverting input terminal of operational amplifier 314 through signal path 310.

The positive power supply input terminal of operational amplifier 314 is electrically coupled to voltage supply 222. One terminal of resistor 316 is electrically coupled to voltage supply 222. The other terminal of resistor 316 is electrically coupled to the non-inverting input terminal of operational amplifier 314, one terminal of resistor 320, and one terminal of capacitor 322 through signal path 318. The other terminal of resistor 320 and the other terminal of capacitor 322 are electrically coupled to one terminal of resistor 326 through signal path 324. The other terminal of resistor 326 and the negative power supply input terminal of operational amplifier 314 are electrically coupled to common or ground 220.

Output filter 214 provides a 2-pole, low pass filter that rejects frequencies higher than about the $9^{th}$ harmonic of the ink drop fundamental frequency. This preserves most of the rapidly changing voltage characteristics of the ink drop pulses while attenuating the higher frequency noise energy that might be present, thus improving the signal to noise ratio. In one example, resistor 300 is 7.5 kilo-ohms, resistor 308 is 3.09 kilo-ohms, capacitor 304 is 0.022 micro-farads, resistor 306 is 9.09 kilo-ohms, and capacitor 312 is 4700 pico-farads. In other examples, resistors 300, 306, and 308, and capacitors 304 and 312 have other suitable values.

Operational amplifier 314 is biased at the non-inverting input of operational amplifier 314 by the voltage divider provided by resistor 316, resistor 320, resistor 326, and capacitor 322. The bias is selected to maximize the allowed (asymmetrical) signal swing produced due to the ink drops (once processed by the transimpedance amplifiers and the summing amplifier) without clipping operational amplifier 314 at either rail. In one example, resistor 316 is 71.5 kilo-ohms, resistor 320 is 36.3 kilo-ohms, resistor 326 is 49.9 ohms, and capacitor 322 is 1 micro-farad. In other examples, resistors 316, 320, and 326, and capacitor 322 have other suitable values.

Figure 6:
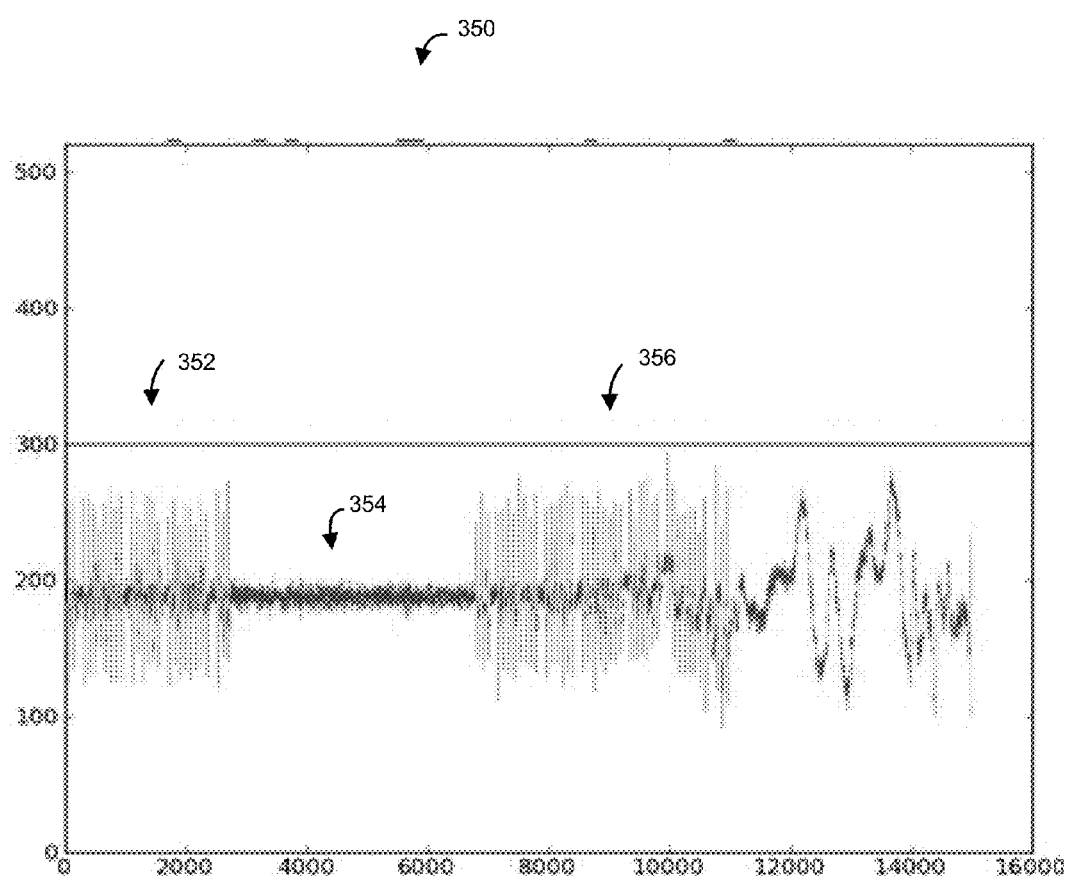
FIG. 6 is a chart illustrating one example of an output signal from the drop detector circuit.

FIG. 6 is a chart 350 illustrating one example of an output signal from the drop detector circuit 200 (FIG. 2). The output signal includes a first burst of pulses 352 due to ink drops, a second burst of pulses 356 due to ink drops, and a section 354 due to a lack of ink drops between the first burst of pulses 352 and the second burst of pulses 356. As illustrated in chart 350, the output signal has low noise and does not clip the output signal on either rail. Thus, post processing of the output signal can easily determine the fraction of the output signal that corresponds to noise versus the portions of the output signal that is due to the backscattered light off of ink drops.

Figure 7:
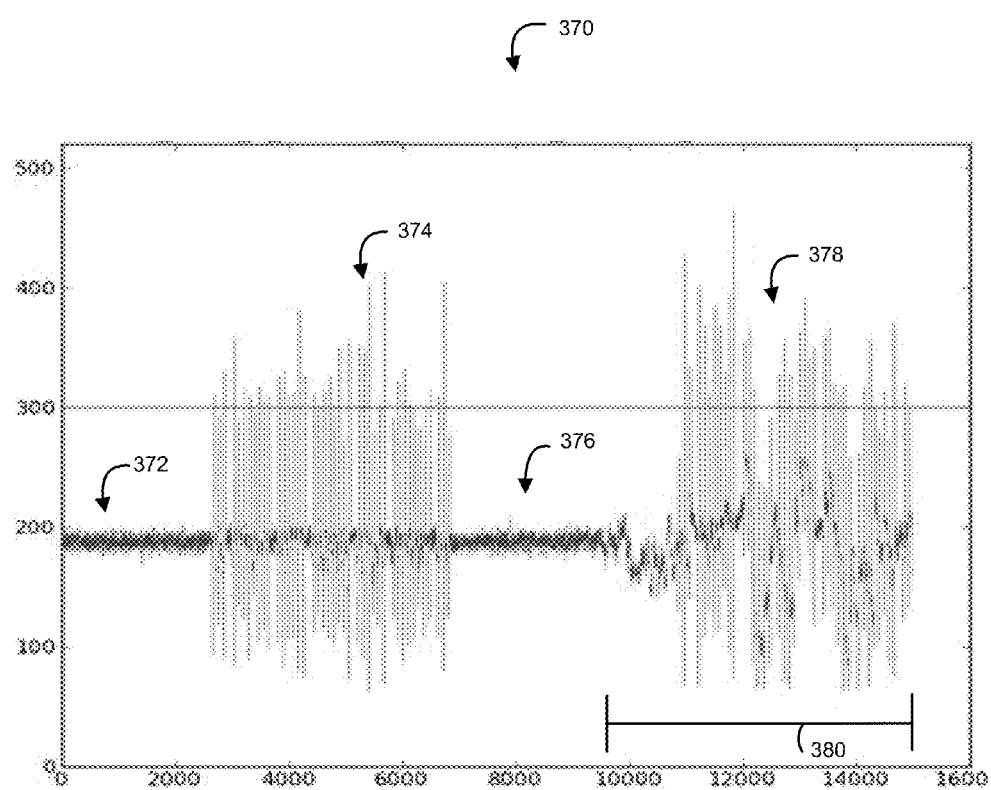
FIG. 7 is a chart illustrating another example of an output signal from the drop detector circuit.

FIG. 7 is a chart 370 illustrating another example of an output signal from the drop detector circuit 200 (FIG. 2). In this example, an artificially created reflection problem is introduced into the drop detector arrangement to illustrate the immunity that drop detector circuit 200 has to such reflections. The output signal includes a section 372 due to a lack of ink drops, followed by a first burst of pulses 374 due to ink drops, followed by a section 376 due to a lack of ink drops, followed by a second burst of pulses 378 due to ink drops. The artificially created reflection problem is indicated at 380 and extends during the end of section 376 and during second burst of pulses 378.

As illustrated in chart 370, the individual pulses remain detectable during the artificially created reflection problem. The noise due to the artificially created reflection problem can be rejected by post processing. Thus, the drop detector circuit is immune to reflection problems.

Although specific examples have been illustrated and described herein, it will be appreciated by those of ordinary skill in the art that a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

What is claimed is:
1. A system comprising:
a photodetector to detect backscattered light from liquid drops to provide a current signal;
a first amplifier to convert the current signal into a first voltage signal;
a second amplifier to amplify the first voltage signal to provide a second voltage signal; and
a filter to filter the second voltage signal to provide an output signal to indicate the presence or absence of liquid drops.

2. The system of claim 1, wherein a DC gain of the first amplifier is about $\frac{1}{28}$ as large as an AC gain of the first amplifier.

3. The system of claim 1, wherein the first amplifier comprises an operational amplifier biased to about $\frac{1}{3}$ of a supply voltage for the first amplifier.

4. The system of claim 1, wherein the second amplifier has a gain set to create full scale second voltage signal swings without clipping at voltage rails of the second amplifier even when a combination of desired and undesired signals is present.

5. The system of claim 1, wherein the second amplifier has an AC coupling time constant set to pass voltage changes produced by liquid drops entering and leaving a field of view of the photodetector and reject voltage changes not produced by liquid drops entering and leaving the field of view of the photodetector.

6. The system of claim 1, wherein the filter comprises a 2-pole, low pass filter.

7. A printer comprising:
a plurality of photodiodes to detect backscattered light from ink drops;
a plurality of transimpedance amplifiers, each transimpedance amplifier to convert a current signal from a respective photodiode into a respective first voltage signal;
a summing amplifier to receive the first voltage signal from each transimpedance amplifier to provide a second voltage signal; and
an output filter to filter the second voltage signal to provide an output signal to indicate the presence or absence of ink drops.

8. The printer of claim 7, wherein a DC gain of each respective transimpedance amplifier is about $\frac{1}{28}$ as large as an AC gain of the respective transimpedance amplifier.

9. The printer of claim 7, wherein each respective transimpedance amplifier comprises an operational amplifier biased to about $\frac{1}{3}$ of a supply voltage for the respective transimpedance amplifier.

10. The printer of claim 7, wherein the summing amplifier has a gain set to create full scale second voltage signal swings without clipping at either voltage rail of the summing amplifier even when a combination of desired and undesired signals is present.

11. The printer of claim 7, wherein the summing amplifier has an AC coupling time constant set to pass voltage changes produced by ink drops entering and leaving a field of view of the photodiodes and reject voltage changes not produced by ink drops entering and leaving the field of view of the photodiodes.

12. The printer of claim 7, wherein the output filter comprises a 2-pole, low pass filter that rejects frequencies higher than about the $9^{th}$ harmonic of an ink drop fundamental frequency.

13. An ink drop detector comprising:
a plurality of photodiodes to detect backscattered light from ink drops;
a plurality of transimpedance amplifiers, each transimpedance amplifier to convert a current signal from a respective photodiode into a respective first voltage signal, each transimpedance amplifier having an AC gain at least 20 times greater than a DC gain of each transimpedance amplifier;
an AC-coupled summing amplifier to receive the first voltage signals to provide a second voltage signal, the AC-coupled summing amplifier having a gain set to create full scale second voltage signal swings without clipping at either voltage rail of the summing amplifier even when a combination of desired and undesired signals is present; and a 2-pole, low pass output filter to filter the second voltage signal to provide an output signal to indicate the presence or absence of ink drops.

14. The ink drop detector of claim 13, wherein each transimpedance amplifier comprises an operational amplifier biased to about ⅓ of a supply voltage for the transimpedance amplifier.

15. The ink drop detector of claim 13, further comprising:
a light source,
wherein the plurality of photodiodes comprises four photodiodes, two of the photodiodes arranged on a first side of the light source and the other two of the photodiodes arranged on a second side of the light source opposite the first side.

16. The system of claim 1, further comprising:
a light source to emit light towards the liquid drops,
wherein the light source and the photodetector are arranged on the same side of the liquid drops.

17. The printer of claim 7, further comprising:
a light source to emit light towards the ink drops,
wherein the light source and the plurality of photodiodes are arranged on the same side of the ink drops.

18. The ink drop detector of claim 13, further comprising:
a light source to emit light towards the ink drops,
wherein the light source and the plurality of photodiodes are arranged on the same side of the ink drops.

* * * * *